United States Patent
Han et al.

(10) Patent No.: US 9,406,838 B2
(45) Date of Patent: Aug. 2, 2016

(54) LIGHT-EMITTING DEVICE (71) Applicant: LG INNOTEK CO., LTD., Seoul (KR)

(72) Inventors: Young Hun Han, Seoul (KR); Seon Ho Lee, Seoul (KR); Ki Young Song, Seoul (KR); Rak Jun Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/406,145

(22) PCT Filed: May 29, 2013

(86) PCT No.: PCT/KR2013/004699
§ 371 (c)(1),
(2) Date: Dec. 5, 2014

(87) PCT Pub. No.: WO2013/183888
PCT Pub. Date: Dec. 12, 2013

(65) Prior Publication Data
US 2015/0144868 A1 May 28, 2015

(30) Foreign Application Priority Data
Jun. 8, 2012 (KR) .................. 10-2012-0061288

(51) Int. Cl.
*H01L 33/04* (2010.01)
*H01L 33/06* (2010.01)
(Continued)

(52) U.S. Cl.
CPC ............... *H01L 33/06* (2013.01); *H01L 33/32* (2013.01); *H01L 33/12* (2013.01)

(58) Field of Classification Search
CPC .......... H01L 33/12; H01L 33/06; H01L 33/32
USPC ........................................................ 257/13
See application file for complete search history.

(56) References Cited

U.S. PATENT DOCUMENTS 7,667,225 B1    2/2010  Lee et al.
9,171,997 B2 *  10/2015 Sim .................. H01L 33/06
(Continued)

FOREIGN PATENT DOCUMENTS

CN   102064252 A   5/2011
EP     2333852 A2  6/2011
(Continued)

OTHER PUBLICATIONS

Keunjoo Kim et al.,"The in compositional gradation effect on photoluminescence in InGaN/GaN multi-quantum-well structures", Journal of Physics: Condensed Matter, Institute of Physics Publishing, Bristol, GB, vol. 18. No. 11, Mar. 22, 2006, pp. 3127-3140, XP020101736.

*Primary Examiner* — Evan Pert
*Assistant Examiner* — Changhyun Yi
(74) *Attorney, Agent, or Firm* — Birch, Stewart, Kolasch & Birch, LLP (57) ABSTRACT

According to one embodiment, a light-emitting element comprises: a first electrically-conductive semiconductor layer, a second electrically-conductive semiconductor layer; and an active layer which is disposed between the first electrically-conductive layer and the second electrically-conductive layer, and in which a well layer and a barrier layer are alternately laminated at least once. The active layer comprises: a first region which is disposed between a neighboring barrier layer and well layer, and linearly reduces the energy band gap; and a second region which is disposed between a neighboring well layer and barrier layer, and linearly increases the energy band gap. In the well layer, at least one first region and second region neighboring the same well layer have mutually different thicknesses.

20 Claims, 7 Drawing Sheets

(51) Int. Cl.
*H01L 33/32* (2010.01)
*H01L 33/12* (2010.01)

(56) References Cited

U.S. PATENT DOCUMENTS

2004/0206949 A1  10/2004  Bour et al.
2008/0217632 A1   9/2008  Tomiya et al.
2009/0224226 A1   9/2009  Huang et al.
2011/0121259 A1*  5/2011  Han et al. .................. 257/13

FOREIGN PATENT DOCUMENTS

| | | |
|---|---|---|
| JP | 7-122812 A | 5/1995 |
| JP | 10-270787 A | 10/1998 |
| JP | 2004-179428 A | 6/2004 |
| KR | 10-2010-0100567 A | 9/2010 |
| KR | 10-1083872 B2 | 11/2011 |
| KR | 10-2012-0009870 A | 2/2012 |

* cited by examiner

LIGHT-EMITTING DEVICE

TECHNICAL FIELD

Embodiments relate to a light emitting element.

BACKGROUND ART

Light emitting elements, such as light emitting diodes (LEDs) and laser diodes, which use a Group III-V or Group II-VI compound semiconductor material, may render various colors such as red, green, blue, and ultraviolet by virtue of development of thin film growth technologies and materials constituting the elements. It may also be possible to produce white light at high efficiency using fluorescent materials or through color mixing. Further, the light emitting elements have advantages, such as low power consumption, semi-permanent lifespan, fast response time, safety, and environmental friendliness as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, and lighting apparatuses using white light emitting diodes as a replacement for fluorescent lamps or incandescent lamps, headlights for vehicles and traffic lights.

Figure 1:
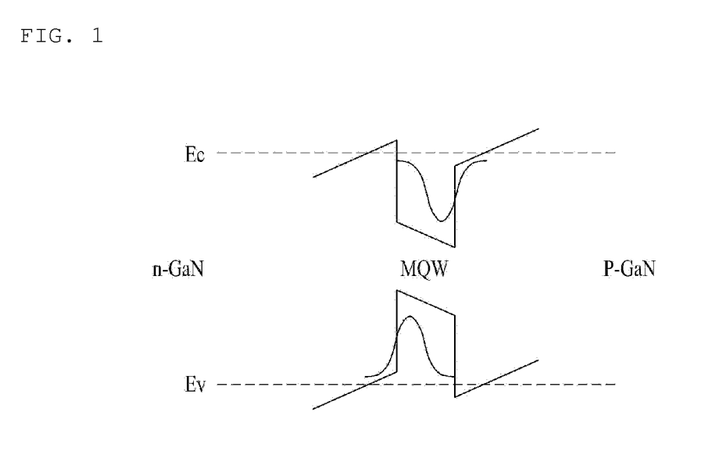
FIG. 1 is a view briefly showing an energy band diagram of an active layer in a general light emitting element.

FIG. 1 is a view briefly showing an energy band diagram of an active layer in a general light emitting element.

Generally, the active layer has a multi-quantum well (MQW) structure including quantum barrier layers and quantum well layers, which are alternately laminated. Stress may be generated in the active layer due to a lattice constant difference between materials constituting the quantum barrier layers and quantum well layers and, as such, polarization may occur in the active layer. As a result, energy band of the active layer may be bent.

When polarization occurs in the active layer, distribution of electrons is inclined toward a p-GaN layer, whereas distribution of holes is inclined toward an n-GaN layer, as shown in FIG. 1. As a result, recombination efficiency of electrons and holes is reduced and, as such, light emission efficiency of the light emitting element is reduced.

Therefore, it is necessary to relieve stress of the active layer while enhancing light emission efficiency of the light emitting element.

DISCLOSURE

Technical Problem

Embodiments are intended to enhance light emission efficiency of a light emitting element.

Technical Solution

In an embodiment, a light emitting element includes a first-conduction-type semiconductor layer, a second-conduction-type semiconductor layer, and an active layer interposed between the first-conduction-type semiconductor layer and the second-conduction-type semiconductor layer, the active layer including barrier layers and well layers alternately laminated at least one time, wherein the active layer further includes first regions each disposed between adjacent ones of the barrier layers and the well layers while having a linearly decreasing energy band gap, and second regions each disposed between adjacent ones of the well layers and the barrier layers while having a linearly increasing energy band gap, wherein, with respect to at least one of the well layers, the first region and the second region, which are disposed adjacent to the well layer, have different thicknesses.

With respect to at least one of the well layers, the first region disposed adjacent to the well layer may have a gentler energy band gap gradient than the second region disposed adjacent to the well layer.

Energy band gap gradients of the first regions may be gradually decreased toward the second-conduction-type semiconductor layer.

With respect to at least one of the well layers, the first region disposed adjacent to the well layer may have a sharper energy band gap gradient than the second region disposed adjacent to the well layer.

Energy band gap gradients of the second regions may be gradually decreased toward the second-conduction-type semiconductor layer.

A total thickness sum of each of the well layers, the first region disposed adjacent to the well layer, and the second region disposed adjacent to the well layer may be constant.

With respect to at least one of the well layers, the first region disposed adjacent to the well layer may have a greater thickness than the second region disposed adjacent to the well layer.

With respect to at least one of the well layers, the second region disposed adjacent to the well layer may have a greater thickness than the first region disposed adjacent to the well layer.

The thickness of each first region may be 10 to 30 Å, and the thickness of each second region may be 5 to 10 Å.

Each well layer may have a thickness of 5 to 10 Å.

The thickness of each first region may be 5 to 10 Å, and the thickness of each second region may be 10 to 30 Å.

The first region most adjacent to the second-conduction-type semiconductor layer among the first regions may have a greatest thickness.

The second region most adjacent to the second-conduction-type semiconductor layer among the second regions may have a greatest thickness.

Thicknesses of the first regions may be gradually increased toward the second-conduction-type semiconductor layer.

Thicknesses of the second regions are gradually increased toward the second-conduction-type semiconductor layer.

Each of the first regions and the second regions may contain In. In contents of the first regions may be linearly increased. In contents of the second regions may be linearly decreased.

With respect to at least one of the well layers, an In content increase rate of the first region disposed adjacent to the well layer may differ from an In content decrease rate at least one second region disposed adjacent to the well layer.

In content increase rates of the first regions may be gradually decreased toward the second-conduction-type semiconductor layer.

In content decrease rates of the second regions may be gradually decreased toward the second-conduction-type semiconductor layer.

The light emitting element may further include an electron blocking layer interposed between the active layer and the second-conduction-type semiconductor layer while having a wider energy band gap than the barrier layers.

The light emitting element may further include a first electrode disposed at the first-conduction-type semiconductor layer, and a second electrode disposed at the second-conduction-type semiconductor layer.

The light emitting element may further include a transparent electrode layer interposed between the second-conduction-type semiconductor layer and the second electrode.

Advantageous Effects

In accordance with the embodiment, the energy band gap of the active layer is linearly varied between the barrier layers and the well layers and, as such, stress applied to the active layer may be relieved, and crystallinity of the active layer may be enhanced.

In addition, an enhancement in electron or hole injection efficiency may be achieved and, as such, light emission efficiency of the light emitting element may be enhanced.

BEST MODE

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. In addition, the size or area of each constituent element does not entirely reflect the actual size thereof.

Figure 2:
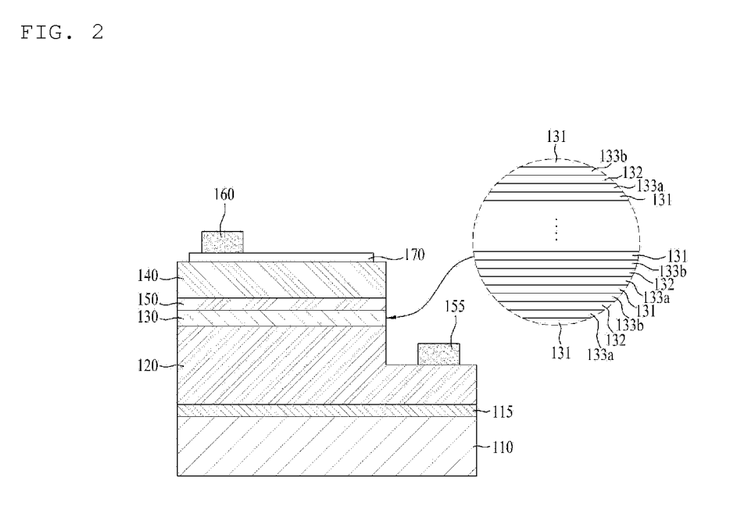
FIGS. 2 and 3 are sectional views of light emitting elements according to embodiments, respectively.
Figure 3:
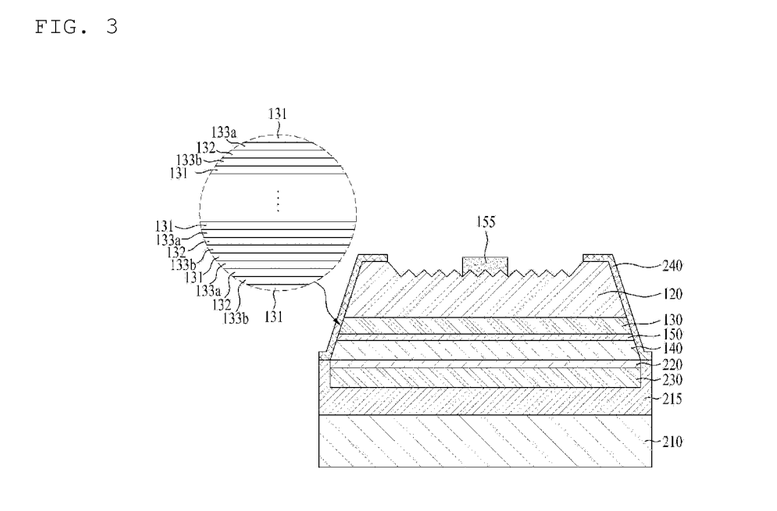

FIGS. 2 and 3 are sectional views of light emitting elements according to embodiments, respectively. FIG. 2 illustrates a horizontal type light emitting element. FIG. 3 illustrates a vertical type light emitting element.

The light emitting element according to each of the illustrated embodiments includes a first-conduction-type semiconductor layer 120, a second-conduction-type semiconductor layer 140, and an active layer 130 interposed between the first-conduction-type semiconductor layer 120 and the second-conduction-type semiconductor layer 140.

The light emitting element includes a light emitting diode (LED) using a plurality of compound semiconductor layers, for example, semiconductor layers of Group III-V or Group II-VI elements. The LED may be a colored LED to emit blue, green, or red light, or an ultraviolet (UV) LED. Light emitted from the LED may be diversified using various semiconductors, although the present disclosure is not limited thereto.

The first-conduction-type semiconductor layer 120, second-conduction-type semiconductor layer 140, and active layer 130 may be collectively referred to as a "light emitting structure".

The light emitting structure may be formed using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like. Of course, the formation method is not limited to the above-described methods.

The first-conduction-type semiconductor layer 120 may be made of a semiconductor compound, for example, a Group III-V or Group II-VI compound semiconductor. The first-conduction-type semiconductor layer 122 may be doped with a first-conduction-type dopant. When the first-conduction-type semiconductor layer 120 is an n-type semiconductor layer, the first-conduction-type dopant is an n-type dopant. The n-type dopant may include Si, Ge, Sn, Se, or Te, although the present disclosure is not limited thereto. When the first-conduction-type semiconductor layer 120 is a p-type semiconductor layer, the first-conduction-type dopant is a p-type dopant. The p-type dopant may include Mg, Zn, Ca, Sr, Ba, or the like, although the present disclosure is not limited thereto.

The first-conduction-type semiconductor layer 120 may include a semiconductor material having a formula of $Al_xIn_yGa_{1-x-y}N$ ($0 \leq x \leq 1$, $0 \leq y \leq 1$, and $0 \leq x+y \leq 1$). The first-conduction-type semiconductor layer 120 may be made of at least one of GaN, InN, AlN, InGaN, AlGaN, InAlGaN, AlInN, AlGaAs, InGaAs, AlInGaAs, GaP, AlGaP, InGaP, AlInGaP, and InP.

The second-conduction-type semiconductor layer 140 may be made of a semiconductor compound, for example, a Group III-V compound semiconductor doped with a second-conduction-type dopant. The second-conduction-type semiconductor layer 140 may include a semiconductor material having a formula of, for example, $In_xAl_yGa_{1-x-y}N$ ($0 \leq x \leq 1$, $0 \leq y \leq 1$, $0 \leq x+y \leq 1$). When the second-conduction-type semiconductor layer 140 is a p-type semiconductor layer, the second-conduction-type dopant is a p-type dopant. The p-type dopant may include Mg, Zn, Ca, Sr, Ba, or the like, although the present disclosure is not limited thereto. When the second-conduction-type semiconductor layer 140 is an n-type semiconductor layer, the second-conduction-type dopant is an n-type dopant. The n-type dopant may include Si, Ge, Sp, Se, or Te, although the present disclosure is not limited thereto.

In each of the illustrated embodiments, the first-conduction-type semiconductor layer 120 may be implemented using an n-type semiconductor layer, and the second-conduction-type semiconductor layer 140 may be implemented using a p-type semiconductor layer. Alternatively, the first-conduction-type semiconductor layer 120 may be implemented using a p-type semiconductor layer, and the second-conduction-type semiconductor layer 140 may be implemented using an n-type semiconductor layer.

Over the second-conduction-type semiconductor layer 140, a semiconductor layer having an opposite polarity to the second-conduction-type may be formed. For example, when the second-conduction-type semiconductor layer 140 is a p-type semiconductor layer, an n-type semiconductor layer (not shown) may be formed over the second-conduction-type semiconductor layer 140. Thus, the light emitting structure may be implemented as one of an n-p junction structure, a p-n junction structure, an n-p-n junction structure, and a p-n-p junction structure.

The active layer 130 is disposed between the first-conduction-type semiconductor layer 120 and the second-conduction-type semiconductor layer 140.

The active layer 130 may be formed to have a multi-well structure in which barrier layers 131 and well layers 132 are alternately laminated at least one time. For example, the active layer 130 may have a multi-quantum well structure through injection of tri-methyl gallium gas (TMGa), ammonia gas ($NH_3$), nitrogen gas ($N_2$), and tri-methyl indium gas (TMIn), although the present disclosure is not limited thereto.

When the active layer 130 has a multi-quantum well structure, the active layer 130 may have well and barrier layers having at least one of layer pair structures of InGaN/GaN, InGaN/InGaN, GaN/AlGaN, InAlGaN/InGaN, GaAs(InGaAs)/AlGaAs, and GaP(InGaP)/AlGaP, although the present disclosure is not limited thereto.

The barrier layers 131 have a wider energy band gap than the well layers 132. The energy band gaps of the barrier layers 131 and well layers 132 may be constant throughout the active layer 130.

A conductive clad layer (not shown) may be formed over and/or beneath the active layer 130. The conductive clad layer may be formed of a semiconductor having a wider band gap than the barrier layer of the active layer 130. For example, the conductive clad layer may have a GaN structure, an AlGaN structure, an InAlGaN structure or a super lattice structure. In addition, the conductive clad layer may be doped with an n-type dopant or a p-type dopant.

The active layer 130 includes first regions 133a each disposed between adjacent ones of barrier layers 131 and well layers 132 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

In an embodiment, when it is assumed that the thickness of each first region 133a is $d_1$, and the thickness of each second region 133b is $d_2$, the thickness $d_1$ of the first region 133a may be greater than the thickness $d_2$ of the second region 133b ($d_1 > d_2$).

In an embodiment, the thickness $d_1$ of each first region 133a may be 10 to 30 Å, and the thickness $d_2$ of each second region 133b may be 5 to 10 Å.

Although, with respect to at least one well layer 132, the thickness $d_1$ of the first region 133a disposed adjacent to the well layer 132 is greater than the thickness $d_2$ of the second region 133b disposed adjacent to the well layer 132, in the above-described embodiment, the thicknesses $d_1$ of all first regions 133a may be thicker than the thicknesses $d_2$ of all second regions 133b in another embodiment.

When, with respect to at least one well layer 132, the thickness $d_1$ of the first region 133a disposed adjacent to the well layer 132 is greater than the thickness $d_2$ of the second region 133b disposed adjacent to the well layer 132, the first region 133a and second region 133b satisfying the condition of "$d_1 > d_2$" may be disposed adjacent to the second-conduction-type semiconductor layer 140.

In this case, the thickness $d_1$ of the first region 133a most adjacent to the second-conduction-type semiconductor layer 140 is greatest.

In another embodiment, each second region 133b may be thicker than each first region 133a ($d_1 < d_2$).

In an embodiment, the thickness $d_1$ of each first region 133a may be 5 to 10 Å, and the thickness $d_2$ of each second region 133b may be 10 to 30 Å.

In an embodiment, with respect to at least one well layer 132, the thickness $d_2$ of the second region 133b disposed adjacent to the well layer 132 is greater than the thickness $d_1$ of the first region 133a disposed adjacent to the well layer 132. Alternatively, the thicknesses $d_2$ of all second regions 133b may be thicker than the thicknesses $d_1$ of all first regions 133a in another embodiment.

When, with respect to at least one well layer 132, the thickness $d_2$ of the second region 133b disposed adjacent to the well layer 132 is greater than the thickness $d_1$ of the first region 133a disposed adjacent to the well layer 132, the first region 133a and second region 133b satisfying the condition of "$d_1 < d_2$" may be disposed adjacent to the second-conduction-type semiconductor layer 140.

In this case, the thickness $d_2$ of the second region 133b most adjacent to the second-conduction-type semiconductor layer 140 may be greatest.

Each well layer 132 may have a thickness $d_3$ of 5 to 10 Å. When the thickness $d_3$ of the well layer 132 is too small, the overlap space between a wave function of electrons and a wave function of holes is narrowed and, as such, recombination efficiency of electrons and holes may be reduced.

The total thickness sum of each well layer 132 and the first and second regions 133a and 133b adjacent to the well layer 132, $d_1 + d_2 + d_3$, may be constant.

In an embodiment, the thicknesses $d_1$ of the first regions 133a may be gradually increased toward the second-conduction-type semiconductor layer 140. When the total thickness sum $d_1 + d_2 + d_3$ of each well layer 132 and the first and second regions 133a and 133b adjacent to the well layer 132 is constant, the thicknesses $d_2$ of the second regions 133b and/or the thicknesses $d_3$ of the well layers 132 may be gradually decreased as the thicknesses $d_1$ of the first regions 133a gradually increase.

Alternatively, the thicknesses $d_2$ of the second regions 133b may be gradually increased toward the second-conduction-type semiconductor layer 140. When the total thickness sum $d_1 + d_2 + d_3$ of each well layer 132 and the first and second regions 133a and 133b adjacent to the well layer 132 is constant, the thicknesses $d_1$ of the first regions 133a and/or the thicknesses $d_3$ of the well layers 132 may be gradually decreased as the thicknesses $d_2$ of the second regions 133b gradually increase.

With respect to at least one well layer 132, the energy band gap of the first region 133a disposed adjacent to the well layer 132 may have a gentler gradient than the energy band gap of the second region 133b disposed adjacent to the well layer 132. In another embodiment, the energy band gap gradients of all first regions 133a may be gentler than those of all second regions 133b.

When, with respect to at least one well layer 132, the energy band gap gradient of the first region 133a disposed adjacent to the well layer 132 is gentler than that of the second region 133b disposed adjacent to the well layer 132, the well layer 132 may be the well layer 132 disposed adjacent to the second-conduction-type semiconductor layer 140.

In an embodiment, the first regions 133a may have energy band gap gradients gradually decreasing toward the second-conduction-type semiconductor layer 140.

Alternatively, with respect to at least one well layer 132, the energy band gap gradient of the first region 133a disposed adjacent to the well layer 132 may be sharper than that of the second region 133b disposed adjacent to the well layer 132. In another embodiment, the energy band gap gradients of all first regions 133a may be sharper than those of all second regions 133b.

When, with respect to at least one well layer 132, the energy band gap gradient of the first region 133a disposed adjacent to the well layer 132 is sharper than that of the second region 133b disposed adjacent to the well layer 132, the well layer 132 may be the well layer 132 disposed adjacent to the second-conduction-type semiconductor layer 140.

In an embodiment, the second regions 133b may have energy band gap gradients gradually decreasing toward the second-conduction-type semiconductor layer 140.

The energy band gap of the active layer 130 may be adjusted in accordance with an In content of a material constituting the active layer 130. As the In content increases, the energy band gap of the active layer 130 decreases. On the other hand, as the In content decreases, the energy band gap of the active layer 130 increases.

Each first region 133a and each second region 133b contain In. The In contents of the first regions 133a linearly increase, whereas the In contents of the second regions 133b linearly decrease.

With respect to at least one well layer 132, the In content increase rate of the first region 133a disposed adjacent to the well layer 132 may differ from the In content decrease rate of the second region 133b disposed adjacent to the well layer 132.

In an embodiment, the In content increase rates of the first regions 133a may be gradually decreased toward the second-conduction-type semiconductor layer 140.

Alternatively, the In content decrease rates of the second regions 133b may be gradually decreased toward the second-conduction-type semiconductor layer 140.

In an embodiment, an electron blocking layer (EBL) 150 may be interposed between the active layer 130 and the second-conduction-type semiconductor layer 140.

Electrons of carriers exhibit high mobility. For this reason, electrons supplied from the first-conduction-type semiconductor layer 120 may escape into the second-conduction-type semiconductor layer 140 via the active layer 130 and, as such, current leakage may occur. The electron blocking layer 150 may function as a potential barrier for preventing current leakage as described above.

The electron blocking layer 150 may have a wider energy band gap than the barrier layers 131 of the active layer 130. The electron blocking layer 150 may have a single layer structure of AlGaN or a multilayer structure of AlGaN/GaN or InAlGaN/GaN, although the present disclosure is not limited thereto.

The light emitting structure including the first-conduction-type semiconductor layer 120, active layer 130, and second-conduction-type semiconductor layer 140 is grown over a growth substrate 110.

The growth substrate 110 may be formed using a material suitable for growth of a semiconductor material or a material having excellent thermal conductivity. The growth substrate 110 may be made of at least one of sapphire ($Al_2O_3$), SiC, GaAs, GaN, ZnO, Si, GaP, InP, Ge, and $Ga_2O_3$. The growth substrate 110 may be wet washed to remove impurities from the surface of the growth substrate 110.

Prior to growth of the first-conduction-type semiconductor layer 120 over the growth substrate 110, an undoped semiconductor layer 115 may be grown over the growth substrate 110.

The undoped semiconductor layer 115 is a layer formed to achieve an enhancement in crystallinity of the first-conduction-type semiconductor layer 120.

The undoped semiconductor layer 115 may be identical to the first-conduction-type semiconductor layer, except that the undoped semiconductor layer 115 has lower electrical conductivity than the first-conduction-type semiconductor layer 120 because no first-conduction-type dopant is doped therein.

A first electrode 155 is disposed on the first-conduction-type semiconductor layer 120. A second electrode 160 is disposed on the second-conduction-type semiconductor layer 140.

Each of the first electrode 155 and second electrode 160 may include at least one of Al, Ti, Mo, Cr, Ni, Cu, and Au. The first electrode 155 may be formed to have a single layer structure or a multilayer structure.

In the case of the horizontal type light emitting element as illustrated in FIG. 2, portions of the second-conduction-type semiconductor layer 140, active layer 130, and first-conduction-type semiconductor layer 120 are selectively etched and, as such, the first electrode 155 is disposed on a surface of the first-conduction-type semiconductor layer 120 exposed in accordance with the etching.

In the case of the vertical type light emitting element as illustrated in FIG. 3, a conductive support substrate 210 is disposed beneath the second-conduction-type semiconductor layer 140 and, as such, may function as the second electrode. The conductive support substrate 210 may be made of a material having high electrical conductivity and high thermal conductivity. For example, the conductive support substrate 210 may be formed as a base substrate having a certain thickness, using a material selected from the group consisting of molybdenum (Mo), silicon (Si), tungsten (W), copper (Cu), aluminum (Al), and alloys thereof. In addition, the conductive support substrate 210 may selectively include gold (Au), a Cu alloy, Ni, Cu—W, a carrier wafer (for example, GaN, Si, Ge, GaAs, ZnO, SiC, SiGe, $Ga_2O_3$, or the like), a conductive sheet, or the like.

Again referring, to FIG. 2, a transparent electrode layer 170 may be interposed between the second-conduction-type semiconductor layer 140 and the second electrode 160.

The transparent electrode layer 170 is adapted to improve electrical contact between the second-conduction-type semiconductor layer 140 and the second electrode 160. For the transparent electrode layer 170, a transmissive conductive layer or a metal may be selectively used. For example, the transparent electrode layer 170 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO (AGZO), In—GaZnO (IGZO), ZnO, $IrO_x$, $RuO_x$, NiO, $RuO_x$/ITO, Ni/$IrO_x$/Au, Ni/$IrO_x$/Au/ITO, Ag, Ni, Cr, Ti, Al, Rh, Pd, Ir, S, In, Ru, Mg, Zn, Pt, Au, and Hf, although the present disclosure is not limited thereto.

Referring to FIG. 3, a reflective layer 230 may be interposed between the second-conduction-type semiconductor layer 140 of the light emitting structure and the conductive support substrate 210.

The reflective layer 230 may effectively reflect light generated from the active layer 130 and, as such, may greatly enhance light extraction efficiency of the light emitting element.

A separate transparent electrode layer 220 may be interposed between the reflective layer 230 and the second-conduction-type semiconductor layer 140. However, when the reflective layer 230 is formed using a material coming into ohmic contact with the second-conduction-type semiconductor layer 140, the transparent electrode layer 220 may be omitted.

The light emitting structure formed with the reflective layer 230 and/or the transparent electrode layer 220 and the conductive substrate layer 210 may be coupled by a bonding layer 215.

The bonding layer 215 may include a barrier metal or a bonding metal. For example, the bonding layer 215 may include at least one of Ti, Au, Sn, Ni, Cr, Ga, In, Bi, Cu, Ag, and Ta, although the present disclosure is not limited thereto.

A roughness pattern may be formed at a surface of the first-conduction-type semiconductor layer 120 of the light emitting structure. The roughness pattern may be formed through execution of a photo enhanced chemical (PEC) etching process or an etching process using a mask pattern. The roughness pattern is adapted to enhance external extraction efficiency of light generated from the active layer 130. The roughness pattern may be uniform or non-uniform.

In addition, a passivation layer 240 may be formed at side surfaces of the light emitting structure and at least a portion of the first-conduction-type semiconductor layer 120.

The passivation layer 240 is made of oxide or nitride, to protect the light emitting structure. For example, the passivation layer 240 may be constituted by a silicon oxide ($SiO_2$) layer, an oxide nitride layer, or an aluminum oxide layer.

Hereinafter, embodiments will be described in more detail with reference to drawings illustrating energy band diagrams.

Figure 4:
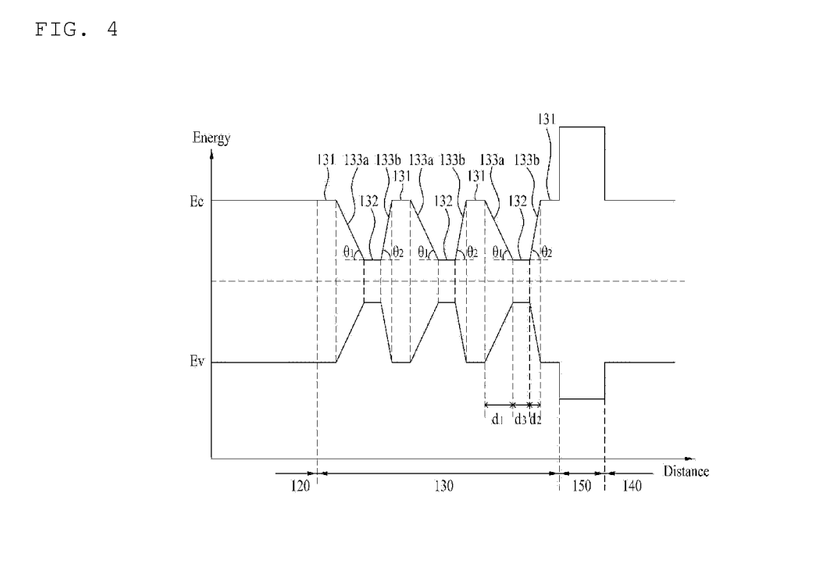
FIG. 4 is a view illustrating an energy band diagram of a light emitting element according to a first embodiment.

FIG. 4 is a view illustrating an energy band diagram of a light emitting element according to a first embodiment.

The light emitting element according to the first embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

Referring to FIG. 4, the energy band gap of the active layer 130 is widest in one barrier layer 131, is gradually narrowed in the first region 133a adjacent to the barrier layer 131, and is narrowest when the first region 133a reaches the well layer 132 adjacent to the first region 133a. The energy band gap of the active layer 130 is then gradually widened in the second region 133b adjacent to the well layer 132, and is widest when the second region 133b reaches another barrier layer 131 adjacent thereto.

Since the energy band gap of the active layer 130 is gradually varied in the first regions 133a and second regions 133b arranged between the barrier layers 131 and the well layers 132, it may be possible to relieve stress caused by lattice mismatch between the barrier layers 131 and the well layers 132. Accordingly, polarization may be reduced. In addition, recombination efficiency of electrons and holes in each well layer 132 may be enhanced.

When it is assumed that the thickness of each first region 133a is $d_1$, and the thickness of each second region 133b is $d_2$, the thickness $d_1$ of the first region 133a may be greater than the thickness $d_2$ of the second region 133b ($d_1 > d_2$).

For example, the thickness $d_1$ of each first region 133a may be 10 to 30 Å, and the thickness $d_2$ of each second region 133b may be 5 to 10 Å.

The thicknesses $d_1$ of the first regions 133a may be equal, and the thicknesses $d_2$ of the second regions 133b may be equal.

Each well layer 132 may have a thickness $d_3$ of 5 to 10 Å. When the thickness $d_3$ of the well layer 132 is too small, the overlap area between a wave function of electrons and a wave function of holes is narrowed and, as such, recombination efficiency of electrons and holes may be reduced.

The total thickness sum of each well layer 132 and the first and second regions 133a and 133b adjacent to the well layer 132, $d_1 + d_2 + d_3$, may be constant, although the present disclosure is not limited thereto.

Since the energy levels of the barrier layers 131 and well layers 132 are constant, the energy band gap gradients of the first regions 133a are gentler than those of the second regions 133b, which are thinner than the first regions 133a.

In other words, when it is assumed that the inclination angle of the energy band gap of each first region 133a with respect to the energy level of each well layer 132 is "$\theta_1$", and the inclination angle of the energy band gap of each second region 133b with respect to the energy level of each well layer 132 is "$\theta_2$", the energy band gap inclination angle $\theta_1$ of each first region 133a is smaller than the energy band gap inclination angle $\theta_2$ of each second region 133b ($\theta_1 < \theta_2$).

The energy band gap inclination angles $\theta_1$ of the first regions 133a may be equal, and the energy band gap inclination angles $\theta_2$ of the second regions 133b may be equal.

In accordance with this embodiment, stress generated between adjacent ones of the barrier layers 131 and well layers 132 may be relieved and, as such, polarization may be reduced. In addition, since the energy band gap gradient of each first region 133a is gentler than that of each second region 133b, injection efficiency of carriers (for example, electrons) supplied from the first-conduction-type semiconductor layer 120 may be enhanced and, as such, recombination efficiency of electrons and holes may be enhanced.

The energy band gap of the active layer 130 may be adjusted in accordance with an In content of a material constituting the active layer 130. As the In content increases, the energy band gap of the active layer 130 decreases. On the other hand, as the In content decreases, the energy band gap of the active layer 130 increases.

Each first region 133a and each second region 133b contain In. The In contents of the first regions 133a linearly increase, whereas the In contents of the second regions 133b linearly decrease.

With respect to at least one well layer 132, the In content increase rate of the first region 133a disposed adjacent to the well layer 132 may differ from the In content decrease rate of the second region 133b disposed adjacent to the well layer 132.

It may be possible to gradually decrease the energy band gap of the active layer 120 by adjusting the In content of the active layer 120 such that each barrier layer 131 has a minimum In content, and each first region 133a has a gradually increased In content. On the other hand, it may be possible to gradually increase the energy band gap of the active layer 120 by adjusting the In content of the active layer 120 such that each well layer 132 has a maximum In content, and each second region 133b has a gradually decreased In content.

Since the In content of the active layer 130 between the barrier layer 131 and the well layer 132 is gradually varied through the first region 133a and the second region 133b without being abruptly varied, it may be possible to relieve stress caused by lattice mismatch. Accordingly, polarization may be reduced. In addition, an enhancement in electron or hole injection efficiency may be achieved by setting the energy band gaps of the first region 133a and second region 133b to be different from each other through adjustment of In contents in the first region 133a and second region 133b. Thus, an enhancement in light emission efficiency may be achieved.

Energy band gap gradients of each first region 133a and each second region 133b according to In content variation may be made using a method of adjusting In volatility of a layer through adjustment of growth temperature of the layer.

Alternatively, it may be possible to adjust the energy band gap gradients of each first region 133a and each second region 133b such that the energy band gap gradient of the first region 133a is gentler than that of the second region 133b by setting growth times of the first region 133a and second region 133b such that the growth time of the first region 133a is longer than that of the second region 133b.

The above-described formation methods for the first regions 133a and second regions 133b are only illustrative and, as such, the present disclosure is not limited thereto.

Figure 5:
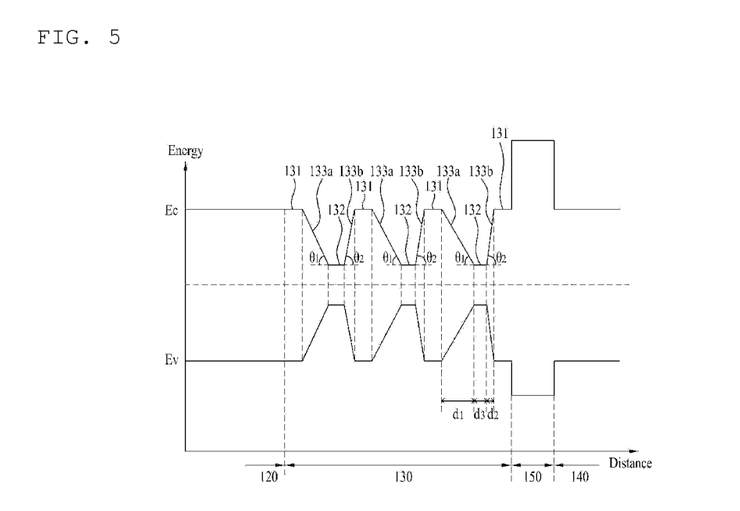
FIG. 5 is a view illustrating an energy band diagram of a light emitting element according to a second embodiment.

FIG. 5 is a view illustrating an energy band diagram of a light emitting element according to a second embodiment.

Contents of this embodiment overlapping with those of the above-described embodiments will not be described hereinafter. The following description will be given in conjunction with differences between this embodiment and the previous embodiments.

The light emitting element according to the second embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

In the second embodiment, the thickness of each first region 133a, $d_1$, may be greater than the thickness of the second region 133b, $d_2$, ($d_1 > d_2$). The thicknesses $d_1$ of the first regions 133a may be gradually increased toward the second-conduction-type semiconductor layer 140.

When the total thickness sum of each well layer 132 and the first and second regions 133a and 133b adjacent to the well layer 132, $d_1+d_2+d_3$, is constant, the thicknesses $d_2$ of the second regions 133b and/or the thicknesses $d_3$ of the well layers 132 may be gradually decreased as the thicknesses $d_1$ of the first regions 133a gradually increase.

Since the energy levels of the barrier layers 131 and well layers 132 are constant, the energy band gap gradients of the first regions 133a are gentler than those of the second regions 133b, which are thinner than the first regions 133a. The energy band gap gradients of the first regions 133a may be gradually decreased toward the second-conduction-type semiconductor layer 140.

In other words, when the energy band gap inclination angle of each first region 133a, $\theta_1$, is smaller than the energy band gap inclination angle of each second region 133b, $\theta_2$, ($\theta_1 < \theta_2$). The energy band gap inclination angles $\theta_1$ of the first regions 133a may be gradually decreased toward the second-conduction-type semiconductor layer 140.

Since the energy band gap gradients of the first regions 133a are gradually varied toward the second-conduction-type semiconductor layer 140, stress generated between adjacent ones of the barrier layers 131 and well layers 132 may be relieved and, as such, polarization may be reduced.

In this case, the first region 133a most adjacent to the second-conduction-type semiconductor layer 140 among the first regions 133a has a minimum energy band gap gradient and, as such, it may be possible to prevent electrons from overflowing to the second-conduction-type semiconductor layer 140 in that energy of electrons is reduced.

The energy band gaps of the first regions 133a and second regions 133b in the active layer 130 may be adjusted in accordance with In contents of the first regions 133a and second regions 133b. Accordingly, the first regions 133a may exhibit In content increase rates gradually decreasing toward the second-conduction-type semiconductor layer 140.

Figure 6:
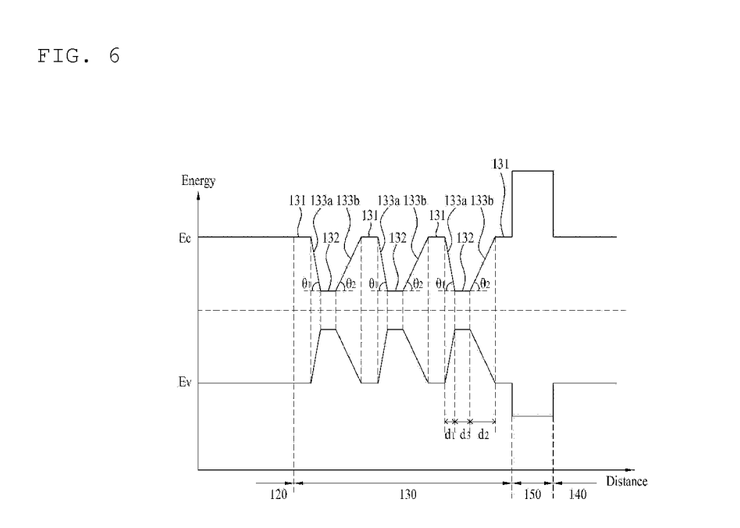
FIG. 6 is a view illustrating an energy band diagram of a light emitting element according to a third embodiment.

FIG. 6 is a view illustrating an energy band diagram of a light emitting element according to a third embodiment.

Contents of this embodiment overlapping with those of the above-described embodiments will not be described hereinafter. The following description will be given in conjunction with differences between this embodiment and the previous embodiments.

The light emitting element according to the third embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

When it is assumed that the thickness of each first region 133a is $d_1$, and the thickness of each second region 133b is $d_2$, the thickness $d_2$ of the second region 133b may be greater than the thickness $d_1$ of the first region 133a ($d_1 < d_2$).

For example, the thickness $d_1$ of each first region 133a may be 5 to 10 Å, and the thickness $d_2$ of each second region 133b may be 10 to 30 Å.

The thicknesses $d_1$ of the first regions 133a may be equal, and the thicknesses $d_2$ of the second regions 133b may be equal.

Since the energy levels of the barrier layers 131 and well layers 132 are constant, the energy band gap gradients of the second regions 133b are gentler than those of the first regions 133a, which are thinner than the second regions 133b.

In other words, when the energy band gap inclination angle of each second region 133b, $\theta_2$, is smaller than the energy band gap inclination angle of each first region 133a, $\theta_1$, ($\theta_1 > \theta_2$). The energy band gap inclination angles $\theta_1$ of the first regions 133a may be gradually decreased toward the second-conduction-type semiconductor layer 140.

The energy band gap inclination angles $\theta_1$ of the first regions 133a may be equal, and the energy band gap inclination angles $\theta_2$ of the second regions 133b may be equal.

In accordance with this embodiment, stress generated between adjacent ones of the barrier layers 131 and well layers 132 may be relieved and, as such, polarization may be reduced. In addition, since the energy band gap gradient of each second region 133b is gentler than that of each first region 133a, injection efficiency of carriers (for example, holes) supplied from the second-conduction-type semiconductor layer 140 may be enhanced and, as such, recombination efficiency of electrons and holes may be enhanced.

The energy band gap of the active layer 130 may be adjusted in accordance with an In content of a material constituting the active layer 130. As the In content increases, the energy band gap of the active layer 130 decreases. On the other hand, as the In content decreases, the energy band gap of the active layer 130 increases.

Each first region 133a and each second region 133b contain In. The In contents of the first regions 133a linearly increase, whereas the In contents of the second regions 133b linearly decrease.

With respect to at least one well layer 132, the In content increase rate of the first region 133a disposed adjacent to the well layer 132 may differ from the In content decrease rate of the second region 133b disposed adjacent to the well layer 132.

Figure 7:
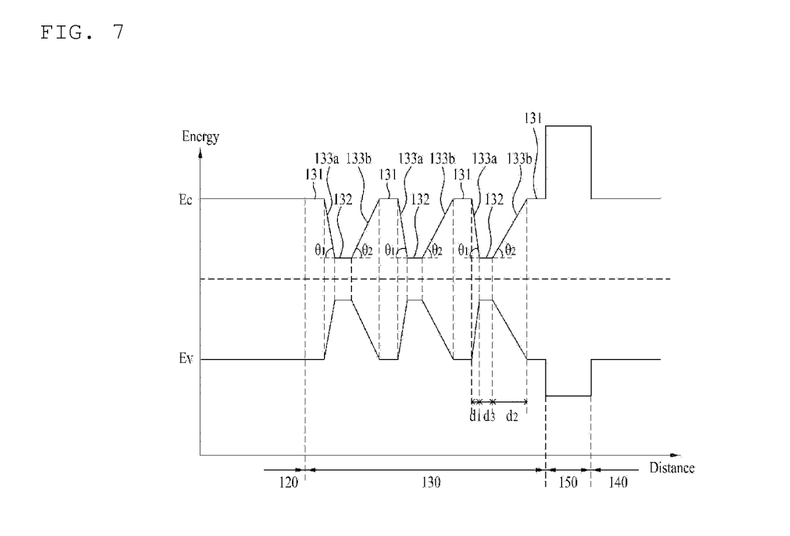
FIG. 7 is a view illustrating an energy band diagram of a light emitting element according to a fourth embodiment.

FIG. 7 is a view illustrating an energy band diagram of a light emitting element according to a fourth embodiment.

Contents of this embodiment overlapping with those of the above-described embodiments will not be described hereinafter. The following description will be given in conjunction with differences between this embodiment and the previous embodiments.

The light emitting element according to the fourth embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

In the fourth embodiment, the thickness of the second region 133b, $d_2$, may be greater than the thickness of each first region 133a, $d_1$, ($d_1 < d_2$) The thicknesses $d_2$ of the second regions 133b may be gradually increased toward the second-conduction-type semiconductor layer 140.

When the total thickness sum $d_1+d_2+d_3$ of each well layer 132 and the first and second regions 133a and 133b adjacent to the well layer 132 is constant, the thicknesses $d_1$ of the first regions 133a and/or the thicknesses $d_3$ of the well layers 132 may be gradually decreased as the thicknesses $d_2$ of the second regions 133b gradually increase.

Since the energy levels of the barrier layers 131 and well layers 132 are constant, the energy band gap gradients of the second regions 133b are gentler than those of the first regions 133a, which are thinner than the second regions 133b. The energy band gap gradients of the second regions 133b may be gradually decreased toward the second-conduction-type semiconductor layer 140.

In other words, the energy band gap inclination angle of each second region 133b, $\theta_2$, is smaller than the energy band gap inclination angle of each first region 133a, $\theta_1$, ($\theta_1 > \theta_2$). The energy band gap inclination angles $\theta_2$ of the second regions 133b may be gradually decreased toward the second-conduction-type semiconductor layer 140.

Since the energy band gap gradients of the second regions 133b are gradually varied toward the second-conduction-type semiconductor layer 140, stress generated between adjacent ones of the barrier layers 131 and well layers 132 may be relieved and, as such, polarization may be reduced.

In this case, the second region 133b most adjacent to the second-conduction-type semiconductor layer 140 among the second regions 133b has a minimum energy band gap gradient and, as such, it may be possible to further enhance injection efficiency of carriers (for example, holes) supplied from the second-conduction-type semiconductor layer 140.

The energy band gaps of the first regions 133a and second regions 133b in the active layer 130 may be adjusted in accordance with In contents of the first regions 133a and second regions 133b. Accordingly, the second regions 133b may exhibit In content decrease rates gradually decreasing toward the second-conduction-type semiconductor layer 140.

Figure 8:
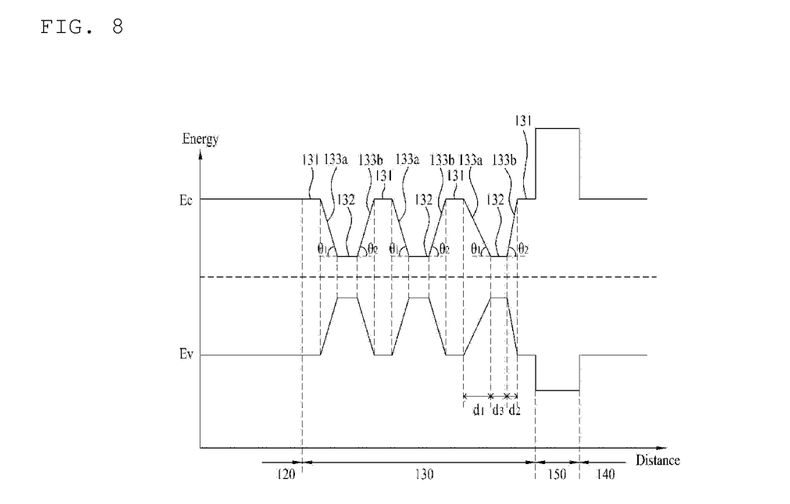
FIG. 8 is a view illustrating an energy band diagram of a light emitting element according to a fifth embodiment.

FIG. 8 is a view illustrating an energy band diagram of a light emitting element according to a fifth embodiment.

Contents of this embodiment overlapping with those of the above-described embodiments will not be described hereinafter. The following description will be given in conjunction with differences between this embodiment and the previous embodiments.

The light emitting element according to the fifth embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

In the fifth embodiment, with respect to at least one well layer 132, the thickness of the first region 133a disposed adjacent to the well layer 132, namely, $d_1$, is equal to the thickness of the second region 133b disposed adjacent to the well layer 132, namely, $d_2$, ($d_1 = d_2$). With respect to at least one of the remaining well layers 132, the thickness $d_1$ of the first region 133a disposed adjacent to the remaining well layer 132 is greater than the thickness $d_2$ of the second region 133b disposed adjacent to the remaining well layer 132 ($d_1 > d_2$). In this case, the thickness $d_1$ of the first region 133a most adjacent to the second-conduction-type semiconductor layer 140 may be greatest.

FIG. 8 illustrates an example in which the thicknesses $d_1$ of the first regions 133a adjacent to two well layers 132 disposed toward the first-conduction-type semiconductor layer 120 among three well layers 132 are equal to the thicknesses $d_2$ of the second regions 133b adjacent to the two well layers 132, and the thickness $d_1$ of the first region 133a adjacent to the remaining well layer 132 disposed toward the second-conduction-type semiconductor layer 140 is greater than the thickness $d_2$ of the second region 133b adjacent to the remaining well layers 132, although the present disclosure is not limited thereto.

The two first regions 133a and two second regions 133b disposed adjacent to the first-conduction-type semiconductor layer 120 may function to relieve stress of the active layer 130. With respect to the well layer 132 disposed adjacent to the second-conduction-type semiconductor layer 140, which may be an area practically emitting light through recombination of electrons and holes, it may be possible to enhance injection efficiency of carriers (for example, electrons) while reducing energy of electrons by setting the thickness $d_1$ of the first region 133a and the thickness $d_2$ of the second region 133b such that the thickness $d_1$ of the first region 133a is greater than the thickness $d_2$ of the second region 133b. Accordingly, it may be possible to prevent electrons from overflowing to the second-conduction-type semiconductor layer 140.

The energy levels of the barrier layers 131 and well layers 132 are constant and, as such, with respect to at least one well layer 132, the energy band gap gradient of the first region 133a disposed adjacent to the well layer 132 is equal to that of the second region 133b disposed adjacent to the well layer 132 and, with respect to at least one of the remaining well layers 132, the energy band gap gradient of the first region 133a disposed adjacent to the remaining well layer 132 is gentler than that of the second region 133b disposed adjacent to the remaining well layer 132. In this case, the energy band gap gradient of the first region 133a most adjacent to the second-conduction-type semiconductor layer 140 may be smallest.

In other words, with respect to at least one of the well layers 132, the energy band gap inclination angle of the first region 133a disposed adjacent to the well layer 132, namely, $\theta_1$, is equal to the energy band gap inclination angle of the second region 133b disposed adjacent to the well layer 132, namely, $\theta_2$, ($\theta_1 = \theta_2$). In addition, with respect to at least one of the remaining well layers 132, the energy band gap inclination angle $\theta_1$ of the first region 133a disposed adjacent to the remaining well layer 132 is smaller than the energy band gap inclination angle $\theta_2$ of the second region 133b disposed adjacent to the remaining well layer 132 ($\theta_1 > \theta_2$).

The energy band gaps of the first regions 133a and second regions 133b in the active layer 130 may be adjusted in accordance with In contents of the first regions 133a and second regions 133b. Accordingly, with respect to at least one of the well layers 132, the In content increase rate of the first region 133a disposed adjacent to the well layer 132 may be equal to the In content decrease rate of the second region 133b disposed adjacent to the well layer 132. In addition, with respect to at least one of the remaining well layers 132, the In content increase rate of the first region 133a disposed adjacent to the remaining well layer 132 may differ from the In content decrease rate of the second region 133b disposed adjacent to the remaining well layer 132.

Referring to FIG. 8, the In content increase rates of the two first regions 133a adjacent to the first-conduction-type semiconductor layer 120 are greater than that of the first region 133a adjacent to the well layer 132 disposed toward the second-conduction-type semiconductor layer 140.

Figure 9:
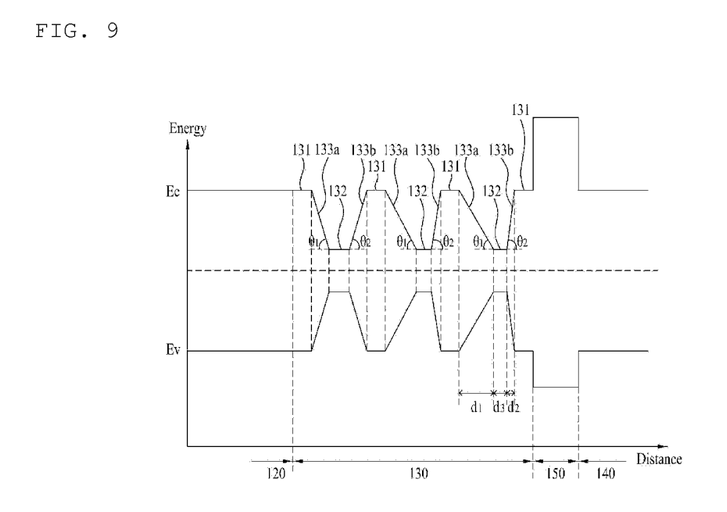
FIG. 9 is a view illustrating an energy band diagram of a light emitting element according to a sixth embodiment.

FIG. 9 is a view illustrating an energy band diagram of a light emitting element according to a sixth embodiment.

Contents of this embodiment overlapping with those of the above-described embodiments will not be described hereinafter. The following description will be given in conjunction with differences between this embodiment and the previous embodiments.

The light emitting element according to the sixth embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

The sixth embodiment differs from the second embodiment in that the thicknesses of the first regions 133a, $d_1$, are gradually increased toward the second-conduction-type semiconductor layer 140 and, with respect to at least one well layer 132 disposed adjacent to the first-conduction-type semiconductor layer 120, the thickness $d_1$ of the first region 133a disposed adjacent to the well layer 132 is equal to the thickness of the second region 133b disposed adjacent to the well layer 132, namely, $d_2$.

FIG. 9 illustrates an example in which the thickness $d_1$ of the first region 133a adjacent to the well layer 132 disposed most adjacent to the first-conduction-type semiconductor layer 120 is equal to the thickness $d_2$ of the second region 133b adjacent to the well layer 132, the thickness $d_1$ of the first region 133a adjacent to each of the remaining well layers 132 is greater than the thickness $d_2$ of the second region 133b adjacent to the remaining well layer 132, and the thicknesses $d_1$ of the first regions 133a are gradually increased toward the second-conduction-type semiconductor layer 140, although the present disclosure is not limited thereto.

Figure 10:
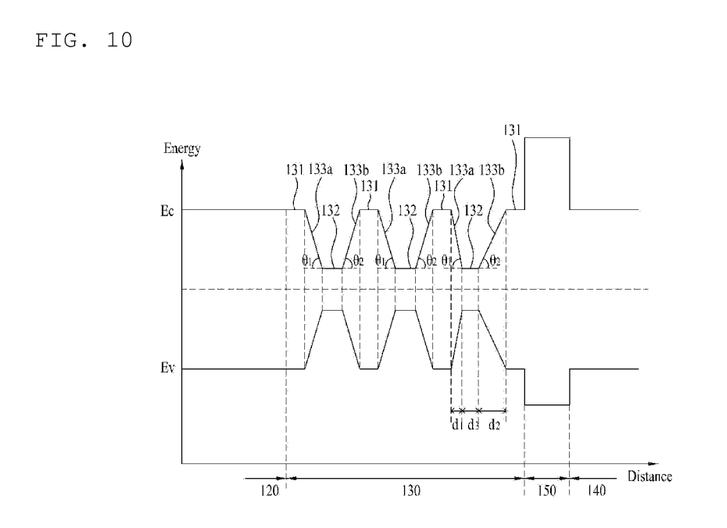
FIG. 10 is a view illustrating an energy band diagram of a light emitting element according to a seventh embodiment.

FIG. 10 is a view illustrating an energy band diagram of a light emitting element according to a seventh embodiment.

Contents of this embodiment overlapping with those of the above-described embodiments will not be described hereinafter. The following description will be given in conjunction with differences between this embodiment and the previous embodiments.

The light emitting element according to the seventh embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

The seventh embodiment differs from the fifth embodiment in that, with respect to at least one well layer 132, the thickness of the first region 133a disposed adjacent to the well layer 132, namely, $d_1$, is equal to the thickness of the second region 133b disposed adjacent to the well layer 132, namely, $d_2$, ($d_1 = d_2$) and, with respect to at least one of the remaining well layers 132, the thickness $d_2$ of the second region 133b disposed adjacent to the remaining well layer 132 is greater than the thickness $d_1$ of the first region 133a disposed adjacent to the remaining well layer 132 ($d_1<d_2$). In this case, the thickness $d_2$ of the second region 133b most adjacent to the second-conduction-type semiconductor layer 140 may be greatest.

FIG. 10 illustrates an example in which the thicknesses $d_1$ of the first regions 133a adjacent to two well layers 132 disposed toward the first-conduction-type semiconductor layer 120 among three well layers 132 are equal to the thicknesses $d_2$ of the second regions 133b adjacent to the two well layers 132, and the thickness $d_2$ of the second region 133b adjacent to the remaining well layer 132 disposed toward the second-conduction-type semiconductor layer 140 is greater than the thickness $d_1$ of the first region 133a adjacent to the remaining well layers 132, although the present disclosure is not limited thereto.

The two first regions 133a and two second regions 133b disposed adjacent to the first-conduction-type semiconductor layer 120 may function to relieve stress of the active layer 130. With respect to the well layer 132 disposed adjacent to the second-conduction-type semiconductor layer 140, which may be an area practically emitting light through recombination of electrons and holes, it may be possible to enhance injection efficiency of carriers (for example, holes) by setting the thickness $d_1$ of the first region 133a and the thickness $d_2$ of the second region 133b such that the thickness $d_2$ of the second region 133b is greater than the thickness $d_1$ of the first region 133a.

Figure 11:
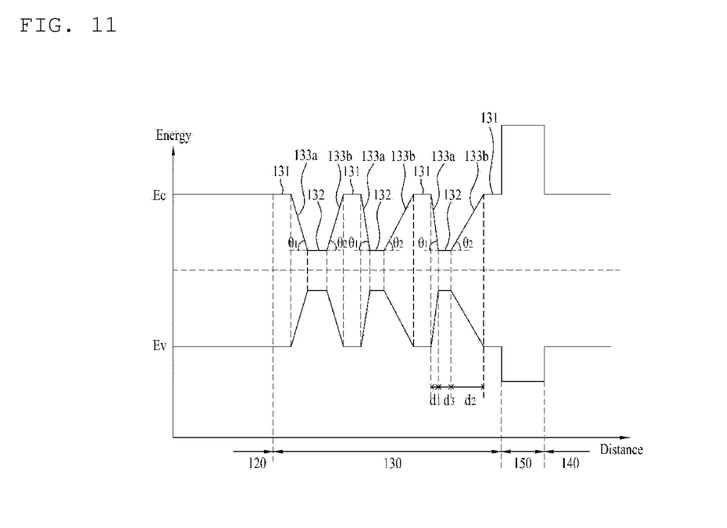
FIG. 11 is a view illustrating an energy band diagram of a light emitting element according to an eighth embodiment.

FIG. 11 is a view illustrating an energy band diagram of a light emitting element according to an eighth embodiment.

Contents of this embodiment overlapping with those of the above-described embodiments will not be described hereinafter. The following description will be given in conjunction with differences between this embodiment and the previous embodiments.

The light emitting element according to the eighth embodiment includes a first-conduction-type semiconductor layer 120, a second-conduction-type semiconductor layer 140, and an active layer 130 interposed between the first-conduction-type semiconductor layer 120 and the second-conduction-type semiconductor layer 140. The active layer 130 includes first regions 133a each disposed between adjacent ones of barrier layers 131 and well layers 132 included in the active layer 130 while having a linearly decreasing energy band gap, and second regions 133b each disposed between adjacent ones of the well layers 132 and barrier layers 131 while having a linearly increasing energy band gap. With respect to at least one of the well layers 132, the first region 133a and second region 133b disposed adjacent to the well layer 132 have different thicknesses.

The eighth embodiment differs from the fourth embodiment in that the thicknesses of the second regions 133b, $d_2$, are gradually increased toward the second-conduction-type semiconductor layer 140 and, with respect to at least one well layer 132 disposed adjacent to the first-conduction-type semiconductor layer 120, the thickness of the first region 133a disposed adjacent to the well layer 132, namely, $d_1$, is equal to the thickness $d_2$ of the second region 133b disposed adjacent to the well layer 132.

FIG. 11 illustrates an example in which the thickness $d_1$ of the first region 133a adjacent to the well layer 132 disposed most adjacent to the first-conduction-type semiconductor layer 120 is equal to the thickness $d_2$ of the second region 133b adjacent to the well layer 132, the thickness $d_2$ of the second region 133b adjacent to each of the remaining well layers 132 is greater than the thickness $d_1$ of the first region 133a adjacent to the remaining well layer 132, and the thicknesses $d_2$ of the second regions 133b are gradually increased toward the second-conduction-type semiconductor layer 140, although the present disclosure is not limited thereto.

Figure 12:
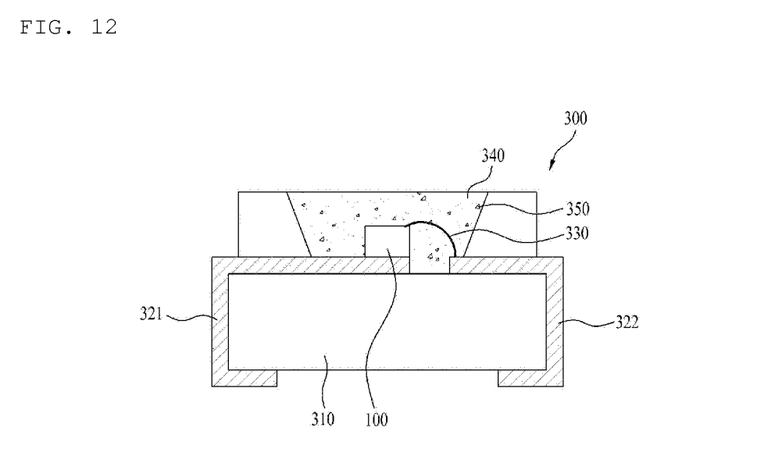
FIG. 12 is a view illustrating a light emitting element package according to an embodiment including one of the light emitting elements according to the above-described embodiments.

FIG. 12 is a view illustrating a light emitting element package according to an embodiment including one of the light emitting elements according to the above-described embodiments.

The light emitting element package according to this embodiment, which is designated by reference numeral "300", includes a body 310, first and second lead frames 321 and 322 disposed at the body 310, the light emitting element according to one of the above-described embodiments, which is designated by reference numeral "100" and disposed at the body 300, to be electrically connected to the first and second lead frames 321 and 322, and a mold 340 formed in a cavity. The cavity may be formed at the body 310.

The body 310 may be made of a silicon material, a synthetic resin material, or a metal material. When the body 310 is made of a conductive material such as a metal material, an insulating layer may be coated over the surface of the body 310, although not shown, in order to avoid electrical short circuit between the first lead frame 321 and the second lead frame 322.

The first and second lead frames 321 and 322 are electrically isolated from each other, and supply current to the light emitting element 100. The first and second lead frames 321 and 322 may also reflect light generated from the light emitting element 100 so as to achieve an enhancement in luminous efficacy. In addition, the first and second lead frames 321 and 322 may function to outwardly dissipate heat generated from the light emitting element 100.

The light emitting element 100 may be mounted on the body 310 or on the first lead frame 321 or second lead frame 322. In this embodiment, the light emitting element 100 is directly electrically connected to the first lead frame 321 while being connected to the second lead frame 322 via a wire 330. The light emitting element 100 may be electrically connected to the lead frames 321 and 322, using a flip-chip method or a die-bonding method, in place of the wire-bonding method.

The mold 340 may encapsulate the light emitting element 100, to protect the light emitting element 100. The mold 340 may include phosphors 350, to change the wavelength of light emitted from the light emitting device 100.

The phosphors 350 may include garnet-based phosphors, silicate-based phosphors, nitride-based phosphors, or oxynitride-based phosphors.

For example, the garnet-based phosphors may be YAG $(Y_3Al_5O_{12}:Ce^{3+})$ or TAG $(Tb_3Al_5O_{12}:Ce^{3+})$. The silicate-based phosphors may be $(Sr,Ba,Mg,Ca)_2SiO_4:Eu^{2+}$. The nitride-based phosphors may be $CaAlSiN_3:Eu^{2+}$ containing SiN. The oxynitride-based phosphors may be $Si_{6-x}Al_xO_xN_{8-x}:Eu^{2+}$ ($0<x<6$).

Light of a first wavelength range emitted from the light emitting device 100 is excited by the phosphors 350 and, as such, is changed into light of a second wavelength range. As the light of the second wavelength range passes through a lens (not shown), the optical path thereof may be changed.

A plurality of light emitting element packages, each of which has the above-described structure according to the illustrated embodiment, is prepared, and is then arrayed on a substrate. Optical members, namely, light guide plates, prism sheets, diffusion sheets, etc., may be arranged on optical paths of the light emitting element packages. Such light emitting element packages, substrate, and optical members may function as a light unit. In accordance with another embodiment, a display device, an indication device or a lighting system may be implemented using the semiconductor light emitting elements or light emitting element packages described in conjunction with the above-described embodiments. The lighting system may include, for example, a lamp or a street lamp.

Hereinafter, a head lamp as an embodiment of the lighting system including the above-described light emitting elements or light emitting element packages will be described.

Figure 13:
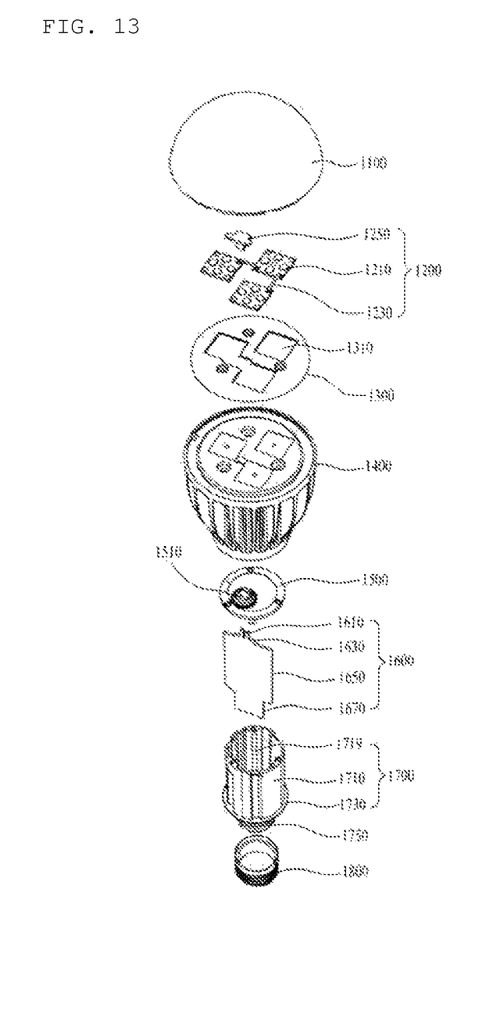
FIG. 13 is a view illustrating a head lamp according to an embodiment, in which a light emitting element according to one of the above-described embodiments is disposed.

FIG. 13 is a view illustrating a head lamp according to an embodiment, in which a light emitting element according to one of the above-described embodiments is disposed.

The lighting device according to this embodiment may include a cover 1100, a light source module 1200, a heat dissipating member 1400, a power supply 1600, an inner case 1700, and a socket 1800. The lighting device according to this embodiment may further include at least one of a member 1300 and a holder 1500. The light source module 1200 may include a light emitting element package according to one of the above-described embodiments.

The cover 110 has a bulb shape or a hemi-spherical shape. The cover 110 may have a hollow structure opened at one side thereof. The cover 1100 may be optically coupled to the light source module 1200. For example, the cover 1100 may diffuse, scatter or excite light supplied from the light source module 1200. The cover 1100 may be an optical member. The cover 1100 may be coupled to the heat dissipating member 1400. The cover 1100 may have a coupling portion to be coupled to the heat dissipating member 1400.

A milky pigment may be coated over an inner surface of the cover 1100. The milky pigment may contain a diffusion agent to diffuse light. The inner surface of the cover 1100 may have greater surface roughness than that of an outer surface of the cover 1100 and, as such, light from the light source module 1200 may be outwardly emitted after being sufficiently scattered and diffused.

The cover. 1100 may be made of glass, plastic, polypropylene (PP), polyethylene (PE), polycarbonate (PC), or the like. In this case, polycarbonate exhibits excellent light resistance, heat resistance and strength. The cover 1100 may be transparent in order to allow the light source module 1200 to be externally visible. Alternatively, the cover 1100 may be opaque. The cover 1100 may be formed through blow molding.

The light source module 1200 may be disposed at one surface of the heat dissipating member 1400. Accordingly, heat from the light source module 1200 may be transferred to the heat dissipating member 1400. The light source module 1200 may include light emitting element packages 1210, connecting plates 1230, and a connector 1250.

The member 1300 is disposed at an upper surface of the heat dissipating member 1400. The member 1300 has guide grooves 1310 to receive the light emitting packages 1210 and connector 1250. The guide grooves 1310 correspond to substrates of the light emitting packages 1210 and the connector 1250, respectively.

A light reflective material may be laminated or coated over a surface of the member 1300. For example, a white pigment may be laminated or coated over the surface of the member 1300. In this case, the member 1300 reflects, toward the cover 1100, light returning toward the light source module 1200 after being reflected from the inner surface of the cover 1100. Accordingly, luminous efficiency of the lighting device according to this embodiment may be enhanced.

The member 1300 may be made of, for example, an insulating material. Each connecting plate 1230 of the light source module 1200 may include an electrical conductive material. In this case, accordingly, electrical contact may be made between the heat dissipating member 1400 and the connecting plate 1230. The member 1300 is made of an insulating material and, as such, may prevent electrical short circuit between the connecting plate 1230 and the heat dissipating member 1400. The heat dissipating member 1400 receives heat from the light source module 1200 and heat from the power supply 1600, and then dissipates the received heat.

The holder 1500 closes receiving grooves 1719 formed at an insulating portion 1710 of the inner case 1700. Accordingly, the power supply 1600, which is received in the insulating portion 1710 of the inner case 1700, is sealed. The holder 1500 has a guide protrusion 1510. The guide protrusion 1510 is provided with a hole, through which a protrusion 1610 of the power supply 1600 passes.

The power supply 1600 processes or converts an electrical signal supplied from an outside, and supplies the resultant signal to the light source module 1200. The power supply 1600 is engaged with the receiving grooves 1719 of the inner case 1700 and, as such, is received in the inner case 1700 in a state of being sealed by the holder 1500. The power supply 1600 may include a guide 1630, a base 1650, and an extension 1670, in addition to the protrusion 1610.

The guide 1630 has a structure outwardly protruding from one side of the base 1650. The guide 1630 may be inserted into the holder 1500. A plurality of elements may be disposed at one surface of the base 1650. These elements may be an AC/DC converter to convert AC power supply from an external power source into DC power, a drive chip to control driving of the light source module 1200, an electrostatic discharge (ESD) protection element to protect the light source module 1200, or the like, although the present disclosure is not limited thereto.

The extension 1670 has a structure outwardly protruding from the other side of the base 1650. The extension 1670 is inserted into a connecting portion 1750 of the inner case 1700, and receives an electrical signal from an outside. For example, the extension 1670 may have a width equal to or smaller than that of the connecting portion 1750 of the inner case 1700. One end of a positive (+) electric wire and one end of a negative (−) electric wire may be electrically connected to the extension 1670. The other end of the positive (+) electric wire and the other end of the negative (−) electric wire may be electrically connected to the socket 1800.

The inner case 1700 may receive a mold therein, together with the power supply 1600. The mold is formed as a molding liquid is solidified. The mold functions to fix the power supply 1600 within the inner case 1700.

Although embodiments have been described with reference to limited embodiments and drawings, the present disclosure is not limited thereto. It will be apparent to those skilled in the art that various modifications and variations can be made.

Thus, it is intended that the present disclosure covers the scope of the present disclosure is determined by the scope of the appended claims and their equivalents.

The invention claimed is:

1. A light emitting device comprising:
a first-conduction-type semiconductor layer;
a second-conduction-type semiconductor layer;
an active layer disposed between the first-conduction-type semiconductor layer and the second-conduction-type semiconductor layer, the active layer comprising barrier layers and well layers alternately laminated at least one time;

a first region disposed between a first well layer and a first barrier layer adjacent to one side of the first well layer; and a second region disposed between the first well layer and a second barrier layer adjacent to another side of the first well layer, wherein the first region has a linearly decreasing energy band gap, wherein the second region has a linearly decreasing energy band gap, and wherein a slope of a gradient of energy band gap from the first well layer to the first barrier layer is different from a slope of a gradient of energy band gap from the first well layer to the second barrier layer.

2. The light emitting device according to claim 1, wherein an energy band gap gradient of the first region is gentler than an energy band gap gradient of the second region.

3. The light emitting device according to claim 1, wherein the energy band gap gradient of the first region gradually decreases toward the second-conduction-type semiconductor layer.

4. The light emitting device according to claim 1, wherein an energy band gap gradient of the first region is sharper than an energy band gap gradient of the second region.

5. The light emitting device according to claim 4, wherein the energy band gap gradient of the second region gradually decreases toward the second-conduction-type semiconductor layer.

6. The light emitting device according to claim 1, wherein a total thickness of each of the well layers, the first region directly contacting the first well layer, and the second region directly contacting the first well layer is constant.

7. The light emitting device according to claim 1, wherein a thickness of the first region is greater than a thickness of the second region.

8. The light emitting device according to claim 7, wherein the first region most adjacent to the second-conduction-type semiconductor layer among the first regions has a greatest thickness.

9. The light emitting device according to claim 1, wherein a thickness of the second region is greater than a thickness of the first region.

10. The light emitting device according to claim 9, wherein the second region most adjacent to the second-conduction-type semiconductor layer among the second regions has a greatest thickness.

11. The light emitting device according to claim 1, wherein Indium contents of the first region linearly increases toward the second-conduction-type semiconductor layer, and Indium contents of the second region linearly decreases toward the second-conduction-type semiconductor layer.

12. The light emitting device according to claim 11, wherein an Indium content increase rate of the first region differs from an Indium content decrease rate of the second region.

13. The light emitting device according to claim 12, wherein the Indium content increase rate of the first region gradually decreases toward the second-conduction-type semiconductor layer.

14. The light emitting device according to claim 13, wherein the Indium content decrease rate of the second region gradually decreases toward the second-conduction-type semiconductor layer.

15. The light emitting device according to claim 14, wherein a thickness of the first region is greater than a thickness of the second region.

16. The light emitting device according to claim 15, wherein the first region most adjacent to the second-conduction-type semiconductor layer among the first regions has a greatest thickness.

17. The light emitting device according to claim 14, wherein a thickness of the second region is greater than a thickness of the first region.

18. The light emitting device according to claim 17, wherein the second region most adjacent to the second-conduction-type semiconductor layer among the second regions has a greatest thickness.

19. A light emitting device comprising:
a first-conduction-type semiconductor layer;
a second-conduction-type semiconductor layer;
an active layer disposed between the first-conduction-type semiconductor layer and the second-conduction-type semiconductor layer, the active layer comprising barrier layers and well layers alternately laminated at least one time,
a first region disposed between a first well layer and first barrier layer adjacent to one side of the first well layer; and
a second region is disposed between the first well layer and a second barrier layer adjacent to another side of the first well layer,
wherein the first region has a linearly decreasing energy band gap,
wherein the second region has a linearly decreasing energy band gap, and
wherein a thickness of the first region and a thickness of the second region directly contact to the first well layer are different from each other.

20. The light emitting device according to claim 19, wherein a total thickness of each of the well layers, the first region directly contacting the first well layer, and the second region directly contacting the first well layer is constant.

* * * * *